US009601390B2

(12) United States Patent
Doris et al.

(10) Patent No.: US 9,601,390 B2
(45) Date of Patent: Mar. 21, 2017

(54) SILICON GERMANIUM FIN FORMATION VIA CONDENSATION

(71) Applicant: International Business Machines Corporation, Armonk, NY (US)

(72) Inventors: Bruce B. Doris, Slingerlands, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/959,177

(22) Filed: Dec. 4, 2015

(65) Prior Publication Data

US 2016/0372384 A1    Dec. 22, 2016

Related U.S. Application Data

(63) Continuation of application No. 14/744,510, filed on Jun. 19, 2015.

(51) Int. Cl.
*H01L 21/70* (2006.01)
*H01L 21/84* (2006.01)
*H01L 29/66* (2006.01)
*H01L 21/8238* (2006.01)

(52) U.S. Cl.
CPC .... *H01L 21/845* (2013.01); *H01L 21/823821* (2013.01); *H01L 29/66795* (2013.01)

(58) Field of Classification Search
None
See application file for complete search history.

(56) References Cited

U.S. PATENT DOCUMENTS

| 2008/0122013 | A1* | 5/2008 | Schepis | H01L 21/845 257/401 |
| 2014/0252483 | A1* | 9/2014 | Nagumo | H01L 21/845 257/351 |

OTHER PUBLICATIONS

Bruce B. Doris, et al., "Silicon Germanium Fin Formation Via Condensation", U.S. Appl. No. 14/744,510, filed Jun. 19, 2015.
List of IBM Patents or Patent Applications Treated as Related; (Appendix P), Filed Feb. 24, 2016, 2 pages.

* cited by examiner

*Primary Examiner* — Shaun Campbell
(74) *Attorney, Agent, or Firm* — Cantor Colburn LLP; Vazken Alexanian

(57) ABSTRACT

A method of forming a finFET device comprises forming a fin in a silicon layer of a substrate, forming a hardmask layer on a top surface of the fin, forming an insulating layer over the fin and the hardmask layer, removing a portion of the insulating layer to expose a portion of the hardmask layer, removing the exposed portion of the hardmask layer to form a cavity that exposes a portion of the silicon layer of the fin, epitaxially growing a silicon germanium (SiGe) material on exposed portions of the silicon layer of the fin in the cavity, and annealing the grown SiGe to drive germanium atoms into the silicon layer of the fin.

18 Claims, 5 Drawing Sheets

SILICON GERMANIUM FIN FORMATION VIA CONDENSATION

DOMESTIC PRIORITY

This application is a continuation of U.S. Non-Provisional Application Ser. No. 14/744,510, entitled "SILICON GERMANIUM FIN FORMATION VIA CONDENSATION", filed Jun. 19, 2015, which is incorporated herein by reference in its entirety.

BACKGROUND

The present invention relates to field effect transistor (FET) devices, and more specifically, to finFET devices. finFET devices are FET devices that include fins arranged on a substrate. Gate stacks are arranged on the fins to form finFET devices that have channel regions partially defined by the fins.

FinFET are multi-gate devices offer advantages over planar gate devices by allowing multiple gates to be more densely arranged on a substrate, thereby reducing the overall size of the microprocessor.

FinFET devices include nFET and pFET type devices. The use of silicon germanium (SiGe) as opposed to Si in the channel region of pFET devices improves the hole mobility of the pFET devices.

SUMMARY

According to one embodiment of the present invention, a method of forming a finFET device comprises forming a fin in a silicon layer of a substrate, forming a hardmask layer on a top surface of the fin, forming an insulating layer over the fin and the hardmask layer, removing a portion of the insulating layer to expose a portion of the hardmask layer, removing the exposed portion of the hardmask layer to form a cavity that exposes a portion of the silicon layer of the fin, epitaxially growing a silicon germanium (SiGe) material on exposed portions of the silicon layer of the fin in the cavity, and annealing the grown SiGe to drive germanium atoms into the silicon layer of the fin.

According to another embodiment of the present invention a method comprises forming a first fin and a second fin in a silicon layer of a substrate, forming a hardmask layer on the first fin and the second fin, depositing an insulator material over the first fin and the second fin, patterning a masking layer over the first fin and a portion of the insulator material, removing the exposed portion of the hardmask layer to form a cavity that exposes a portion of the silicon layer of the second fin, growing a silicon germanium (SiGe) material in the cavity, and annealing the grown SiGe material such that the Ge in the grown SiGe material migrates into the silicon layer of the fin such that the silicon layer of the second fin includes SiGe.

According to yet another embodiment of the present invention a device comprises a silicon (Si) fin arranged on an insulator layer of a substrate, a silicon germanium (SiGe) fin arranged on the insulator layer of the substrate, wherein the cross-sectional profile of the Si fin and the SiGe fin are substantially similar, and a gate stack arranged over the Si fin and the SiGe fin.

According to yet another embodiment of the present invention, a method comprises forming a first fin and a second fin in a silicon layer of a substrate, forming a hardmask layer on the first fin and the second fin, depositing an insulator material over the first fin and the second fin, patterning a masking layer over the first fin and a portion of the insulator material, removing the exposed portion of the hardmask layer to form a cavity that exposes a portion of the silicon layer of the second fin, growing a silicon material in the cavity, and annealing the grown material such that molecules in the grown material migrates into the silicon layer of the fin such that the silicon layer of the second fin includes silicon and molecules from the grown material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The use of SiGe to fabricate fins in pFET type finFET devices improves the performance of the pFET devices over the use of Si to fabricate fins. The use of SiGe in the channel region of pFET type finFET devices increases the hole mobility in the channel region of the devices. Previous methods of forming SiGe fins having a desired cross-sectional profile have been difficult due to the nature of epitaxially growing SiGe material.

The growth of SiGe can result in defects which lead to strain loss under certain conditions. As the Ge content in the material increases, there is a greater tendency to form defects in the grown material due to lattice mismatch of SiGe compared to silicon. The lattice mismatch leads to strain, which results in improved mobility for holes and increased performance for pFETS. However, as the layer thickness increases and the Ge content increases, the strain can reach levels that are substantially high and the system has a tendency to relax by forming defects.

Previous SiGe FinFET formation processes grew relatively large areas of SiGe followed by Fin patterning. A state of the art process flow includes Fin cleans, resist strips, pre gate cleans and other processes that do not erode silicon but can easily erode silicon germanium and thus compromise the thickness of SiGe Fins compared to silicon Fins. Processes where Si and SiGe Fins are patterned simultaneously, can be compromised especially during dry reactive etching processes. Specifically, a given RIE process that can etch Si may etch SiGe faster and vice versa so that the Fin dimensions are not similar for Si and SiGe Fins.

The methods and resultant structures described below include the fabrication of pFET type finFETs with fins that include SiGe material. In particular, embodiments herein describe a process of forming a SiGe fin with minimal to no fin width loss during fin formation. In contrast to existing techniques for SiGe fin formation that result in fin width loss or defective SiGe fins, embodiments herein utilize a combination of SiGe condensation techniques to form fins with little or no fin width loss.

Figure 1:
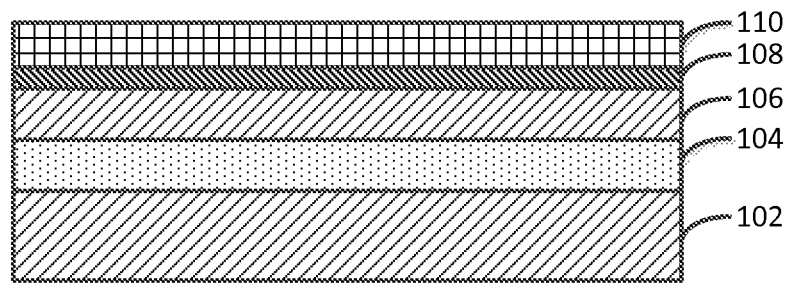
FIG. 1 illustrates a side view of a substrate.

FIG. 1 illustrates a side view of a substrate 102 that includes a silicon material. A buried oxide (insulator) layer 104 is disposed on the substrate 102, and a silicon on insulator (SOI) layer 106 is disposed on the buried oxide layer 104. In addition, a hardmask layer including an oxide layer 108 and a nitride layer 110 is formed on the SOI layer 106. The oxide layer 108 may be formed by, for example, a thermal oxidation process. The nitride layer 110 may include, for example, silicon nitride (SiN) disposed on the oxide layer 108. The nitride layer 110 may be formed by a suitable deposition process such as, for example, a chemical vapor deposition (CVD) process.

Figure 2:
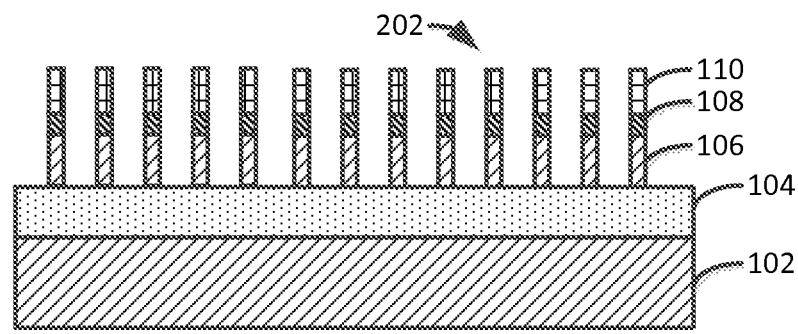
FIG. 2 illustrates the resultant structure following the formation of fins.

FIG. 2 illustrates the resultant structure following the formation of fins 202. The fins 202 are formed by patterning and removing portions of the nitride layer 110, the oxide layer 108, and the SOI layer 106 using a suitable lithographic patterning and etching process such as, for example, reactive ion etching (RIE). At this stage of processing, the silicon fins 202 (including the hardmask layer 108/110) are disposed in both n and p regions of the device.

Figure 3:
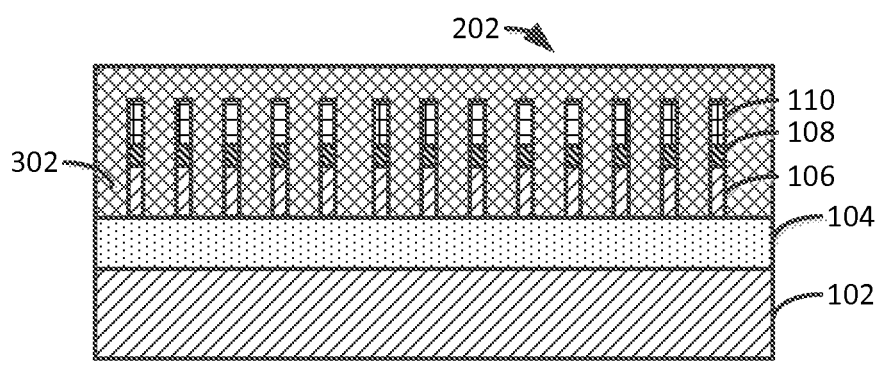
FIG. 3 illustrates the formation of an oxide layer over the fins.

FIG. 3 illustrates the formation of an oxide layer 302 over the fins 202 and exposed portions of the buried oxide layer 104. The oxide layer 302 may be formed by, for example, depositing a flowable oxide material using a CVD process.

Figure 4:
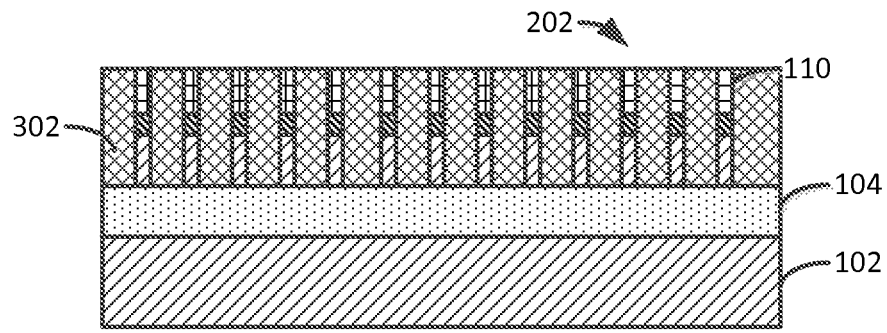
FIG. 4 illustrates the resultant structure following a planarization process.

FIG. 4 illustrates the resultant structure following a planarization process such as, for example, a chemical mechanical polishing (CMP) process that removes portions of the oxide layer 302 and exposes portions of the hardmask layer 108/110 of the fins 202.

Figure 5:
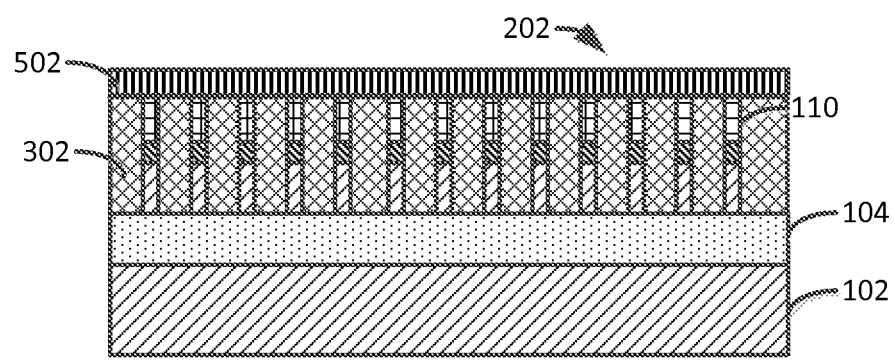
FIG. 5 illustrates the formation of a masking layer.

FIG. 5 illustrates the formation of a masking layer 502 over the oxide layer 302 and exposed portions of the fins 202. The masking layer 502 may include a suitable masking material such as, for example, a nitride material or a photoresist material.

Figure 6:
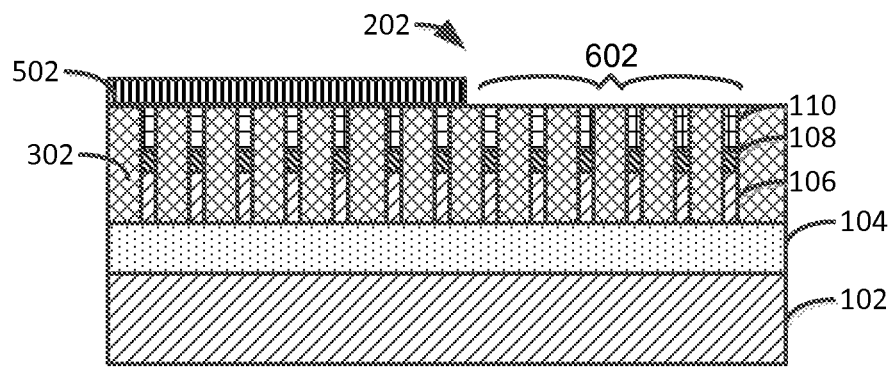
FIG. 6 illustrates the resultant structure following the removal of a portion of the masking layer.

FIG. 6 illustrates the resultant structure following patterning of the masking layer 502, to expose the portion of the fins 202 located in the p region 602 of the device. The fins 202 in the p region 602 are exposed by, for example, a lithographic patterning and etching process that removes a portion of the masking layer 502.

Figure 7:
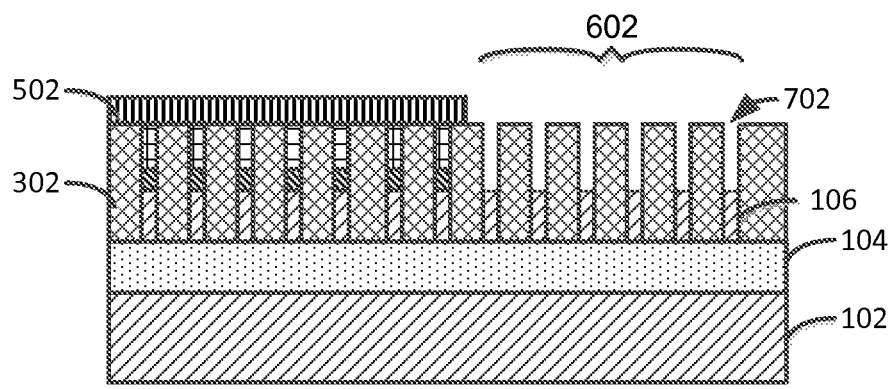
FIG. 7 illustrates the removal of a portion of the fins to form cavities.

FIG. 7 illustrates the removal the hardmask layer 108/110 over the fins 202 in the p region 602 to define cavities 702 within the oxide layer 302. The cavities 702 are formed by, for example, a selective etching process that removes the exposed nitride layer 110 and the oxide layer 108 to expose the silicon material 106 of the fins in the p region 602. In an alternate embodiment, the silicon material 106 may be recessed by, for example, 1 nm to 20 nm or more prior to SiGe growth.

Figure 8:
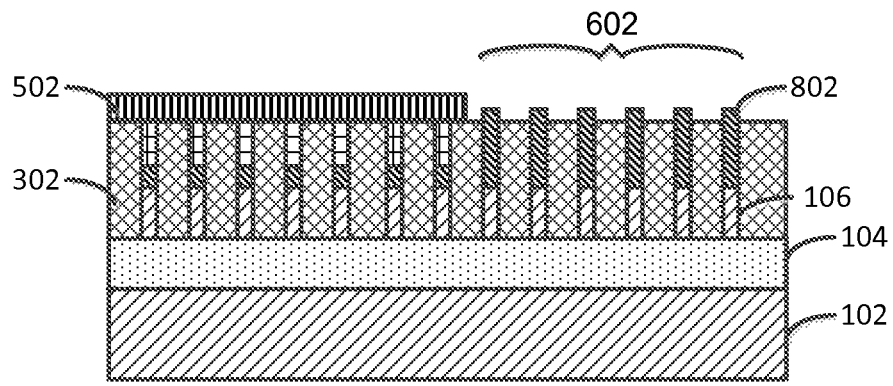
FIG. 8 illustrates the growth of a SiGe layer.

FIG. 8 illustrates the growth of a SiGe layer 802 on the exposed silicon material 106 of the fins in the p region 602. The SiGe layer 802 is formed by performing an epitaxial growth process that grows SiGe on exposed silicon, but does not grow SiGe on exposed oxide such as the oxide layer 302 or the masking layer 502 material. The epitaxially grown SiGe layer 802 fills the cavities 702 (of FIG. 7) such that the resultant profile of the SiGe layer 802 conforms to the profile of the cavities 702.

Figure 9:
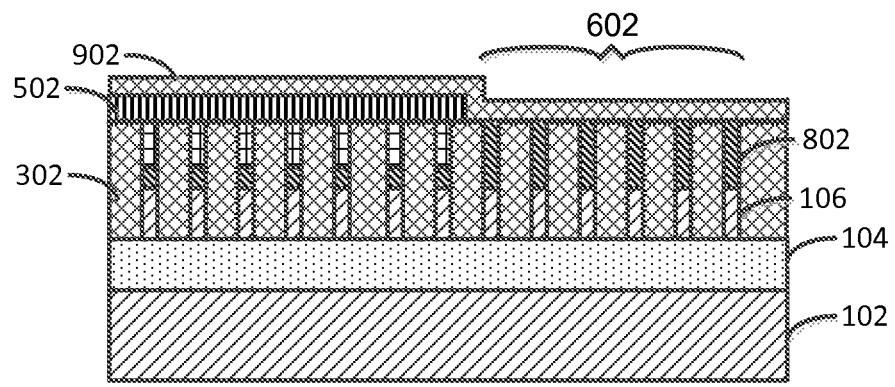
FIG. 9 illustrates the formation of an oxide layer.

FIG. 9 illustrates the formation of another oxide layer 902 over the masking layer 502 and exposed portions of the oxide layer 302 and the SiGe layer 802 portion of the fins 602. The oxide layer 902 may be formed by, for example depositing an oxide material such as a flowable oxide material using a CVD process.

Figure 10:
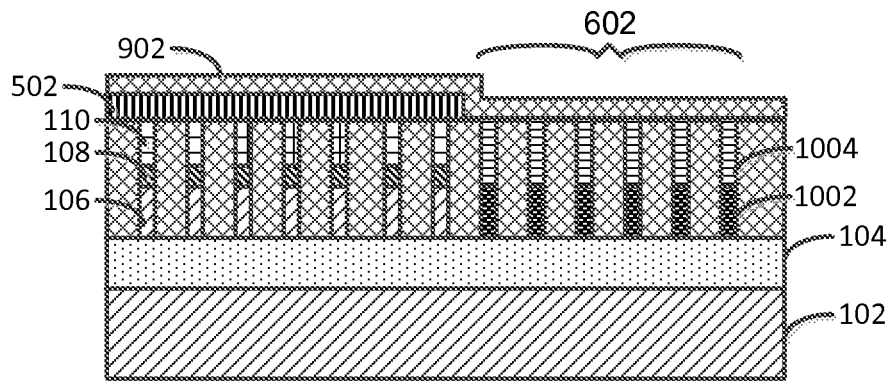
FIG. 10 illustrates the resultant structure following a thermal oxidation and annealing process.

FIG. 10 illustrates the resultant structure following a thermal oxidation and annealing process. The oxidation and annealing process causes the Ge atoms in the SiGe layer 802 (of FIG. 9) of the fins to migrate/diffuse into the silicon fin layer 106 (of FIG. 9), which results in a transformation of silicon material fin 106 to a SiGe material fin 1002 shown in FIG. 10. Following the migration of Ge from the SiGe layer 802, the former SiGe layer 802 substantially becomes $SiO_2$. Thus, the fins in the p region 602 in FIG. 10 include a SiGe layer portion 1002 and a $SiO_2$ layer portion 1004.

An example of the thermal oxidation and annealing process includes growing an SiGe film using 10-90% Ge with a similar thickness to the Si Fin height. An oxide film may be deposited over the wafer and a thermal oxidation process in a furnace or RTP tool is employed using a process thermal in the range of 700 C to 1000 C or more for enough time to oxidize the SiGe layer. In an alternate embodiment the SiGe film can be grown with similar thickness and concentration as stated above and the Ge can be diffused into the silicon Fin using a thermal annealing process with temperature ranging from 700 to 1050 C or more for approximately 10 minutes to 3 hours.

Figure 11:
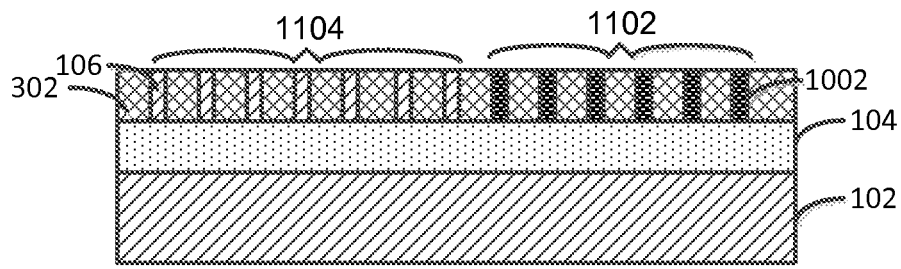
FIG. 11 illustrates the resultant structure following a planarization process.

FIG. 11 illustrates the resultant structure following a planarization process such as, for example, CMP that removes the oxide layer 902, the masking layer 502, the nitride layer 110 and the oxide layer 108 of the n region, as well as and the $SiO_2$ layer portion 1004 of the p regions. The planarization process thus exposes n region fins 1104 that are formed from original silicon material 106 material, and also exposes the p region fins 1102 that are substantially SiGe material 1002.

Figure 12:
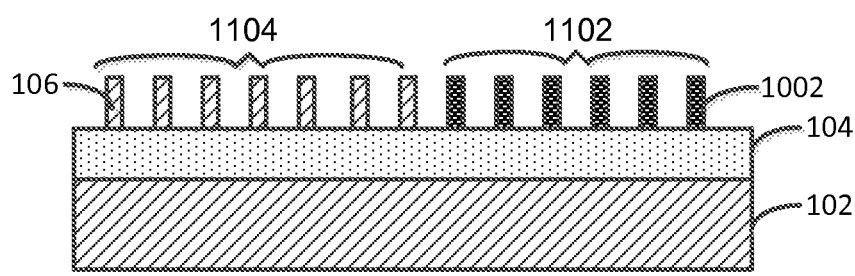
FIG. 12 illustrates the resultant structure following the removal of the oxide layer.

FIG. 12 illustrates the resultant structure following the removal of the oxide layer 302 (of FIG. 11) using a suitable selective chemical etching process that exposes the fins 1104 and 1102 and the buried oxide layer 104. The cross sectional profiles of the fins 1104 and 1102 are substantially similar or substantially identical even though the fins 1104 and 1102 are formed from Si and SiGe, respectively.

Figure 13:
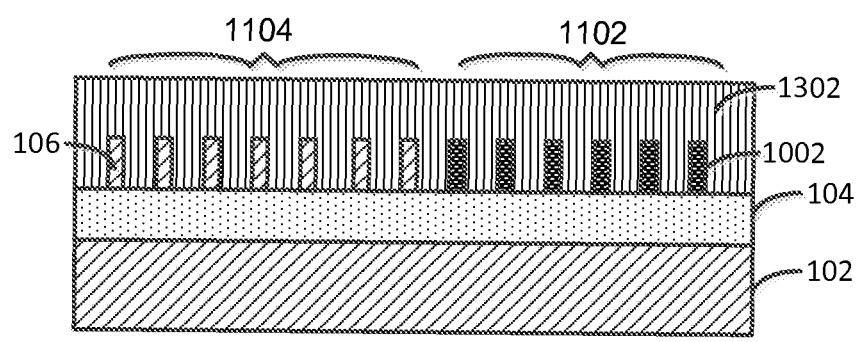
FIG. 13 illustrates the formation of a gate stack.

FIG. 13 illustrates the formation of a gate stack 1302 over portions of the fins 1104 and 1102 using a suitable deposition and patterning process to form the gate stack 1302 the fins 1104 and 1102 substantially define finFET devices. The gate stacks 1302 may include, for example, a metal layer formed over the fins 1104 and 1102, a dielectric material layer such as polysilicon formed over the metal layer and an oxide capping layer formed over the polysilicon layer. The gate stacks may be patterned using an etching process such as, for example RIE.

Figure 14:
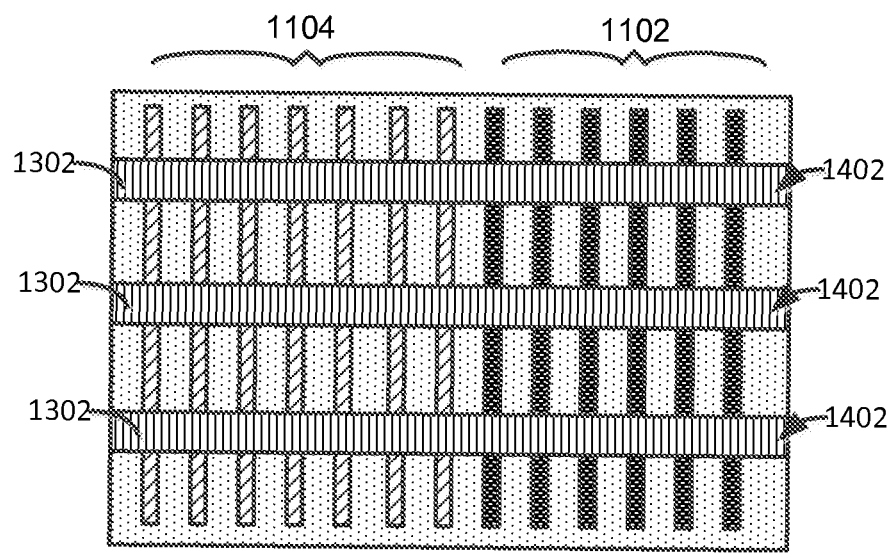
FIG. 14 illustrates a top view of FIG. 13 showing the arrangement of gate stacks over the fins.

FIG. 14 illustrates a top view of FIG. 13 showing the arrangement of gate stacks 1302 over the fins 1104 and 1102. Following the formation of the gate stacks, portions of the fins 1104 and 1102 may be doped using a process such as, for example, ion implantation to form source and drain regions of the finFET devices 1402. In the illustrated exemplary embodiment the fins 1102 may be doped with p-type ions to form pFET devices having SiGe channels, which have a desirable high hole mobility, while the fins 1104 may be doped with n-type ions to form nFET devices having Si channels.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of forming a finFET device, the method comprising:
    forming a fin in a silicon layer of a substrate;
    forming a hardmask layer on a top surface of the fin;
    forming an insulating layer over the fin and the hardmask layer;
    removing a portion of the insulating layer to expose a portion of the hardmask layer;
    removing the exposed portion of the hardmask layer to form a cavity that exposes a portion of the silicon layer of the fin;
    epitaxially growing a silicon germanium (SiGe) material on exposed portions of the silicon layer of the fin in the cavity;
    annealing the grown SiGe to drive germanium atoms into the silicon layer of the fin;
    removing the grown SiGe material and a portion of the insulating layer to expose the silicon layer of the fin that includes SiGe; and
    removing the insulating layer to expose an insulator layer of the substrate.

2. The method of claim 1, further comprising forming a gate stack over a portion of the fin.

3. The method of claim 1, wherein prior to annealing the grown SiGe material, forming an oxide material layer over the grown SiGe material.

4. The method of claim 1, wherein the silicon layer of the substrate is a silicon on insulator layer.

5. The method of claim 1, wherein after the Ge in the grown SiGe material migrates into the silicon layer of the fin, the grown SiGe material comprises substantially $SiO_2$.

6. The method of claim 1, wherein the annealing the grown SiGe material includes oxidizing the grown SiGe material.

7. A method comprising:
    forming a first fin and a second fin in a silicon layer of a substrate;
    forming a hardmask layer on the first fin and the second fin;
    depositing an insulator material over the first fin and the second fin;
    patterning a masking layer over the first fin and a portion of the insulator material;
    removing the exposed portion of the hardmask layer to form a cavity that exposes a portion of the silicon layer of the second fin;
    growing a silicon germanium (SiGe) material in the cavity;
    annealing the grown SiGe material such that the Ge in the grown SiGe material migrates into the silicon layer of the fin such that the silicon layer of the second fin includes SiGe;
    removing the masking layer and the hardmask layer over the first fin to expose a portion of the silicon layer of the first fin;
    removing the grown SiGe material to expose the silicon layer of the second fin that includes SiGe; and
    removing the insulator material to expose an insulator layer of the substrate.

8. The method of claim 7, further comprising forming a gate stack over a portion of the first fin and the second fin.

9. The method of claim 7, wherein prior to annealing the grown SiGe material, forming an oxide material layer over the grown SiGe material.

10. The method of claim 7, wherein the SiGe material is grown by an epitaxial process.

11. The method of claim 7, wherein the silicon layer of the substrate is a silicon on insulator layer.

12. The method of claim 7, wherein after the Ge in the grown SiGe material migrates into the silicon layer of the fin, the grown SiGe material comprises substantially $SiO_2$.

13. The method of claim 7, wherein the annealing the grown SiGe material includes oxidizing the grown SiGe material.

14. The method of claim 7, wherein the hardmask layer includes an oxide material.

15. A method comprising:
    forming a first fin and a second fin in a silicon layer of a substrate;
    forming a hardmask layer on the first fin and the second fin;

depositing an insulator material over the first fin and the second fin;

patterning a masking layer over the first fin and a portion of the insulator material;

removing an exposed portion of the hardmask layer to form a cavity that exposes a portion of the silicon layer of the second fin;

growing a silicon material in the cavity;

annealing the grown material such that molecules in the grown material migrates into the silicon layer of the fin such that the silicon layer of the second fin includes silicon and molecules from the grown material; and removing the grown material and a portion of the insulating layer to expose the silicon layer of the fin that includes the silicon and the molecules from the grown material; and removing the insulating layer to expose an insulator layer of the substrate.

16. The method of claim 15, further comprising forming a gate stack over a portion of the fin.

17. The method of claim 15, wherein prior to annealing the grown material, forming an oxide material layer over the grown material.

18. The method of claim 15, wherein the grown material is grown by an epitaxial process.

* * * * *